United States Patent
Unno et al.

(10) Patent No.: US 7,173,220 B2
(45) Date of Patent: Feb. 6, 2007

(54) HEATING DEVICE

(75) Inventors: Yutaka Unno, Handa (JP); Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/086,771

(22) Filed: Mar. 22, 2005

(65) Prior Publication Data

US 2005/0211691 A1  Sep. 29, 2005

(30) Foreign Application Priority Data

Mar. 26, 2004 (JP) ............................. P2004-093180

(51) Int. Cl.
*H05B 3/68* (2006.01)
*H05B 3/10* (2006.01)

(52) U.S. Cl. .................................. 219/444.1; 219/547

(58) Field of Classification Search ............. 219/443.1, 219/444.1, 544, 546, 547; 118/724, 725, 118/728
See application file for complete search history.

(56) References Cited

U.S. PATENT DOCUMENTS

| 5,688,331 | A  | * | 11/1997 | Aruga et al. ................ 118/725 |
| 6,423,949 | B1 | * | 7/2002  | Chen et al. ............... 219/444.1 |
| 2004/0168641 | A1 | * | 9/2004 | Kuibira et al. .............. 118/728 |

FOREIGN PATENT DOCUMENTS

JP  2001-102157 A1  4/2001
JP  2003-309049 A1  10/2003

* cited by examiner

*Primary Examiner*—Sang Y. Paik
(74) *Attorney, Agent, or Firm*—Burr & Brown

(57) ABSTRACT

A heating device comprises a substrate having a heating surface, a heating element buried in the substrate, a cylindrical member joined to the substrate, and lead wires for supplying current to the heating element. In addition, the thermal conductivity of the substrate is about 1.0 to about 2.0 times the thermal conductivity of the cylindrical member.

2 Claims, 1 Drawing Sheet

HEATING DEVICE

CROSS REFERENCE TO RELATED APPLICATIONS

This application is based upon and claims the benefit of priority from prior Japanese Patent Application No. P2004-93180, filed on Mar. 26, 2004; the entire contents of which are incorporated herein by reference.

BACKGROUND OF THE INVENTION

1. Field of the Invention

The present invention relates to a heating device, which includes a substrate having a heating surface and a cylindrical member.

2. Description of the Related Art

There are semiconductor manufacturing apparatuses that include a ceramic heater for heating a wafer. The ceramic heater includes a plate having a heating surface and a cylindrical member supporting the plate. For example, a ceramic heater having multiple heating elements in the plate is disclosed (e.g., Japanese Patent Application Laid-open No. 2001-102157, p. 3–4, FIG. 1). Furthermore, a ceramic heater having the specified difference in coefficient of thermal expansion between the plate and the cylindrical member is disclosed (e.g., Japanese Patent Application Laid-open No. 2003-309049, p. 3, FIG. 1).

However, conventional ceramic heaters allow heat of the heating surface to leave via the cylindrical member joined to the central part of the plate, thereby lowering the temperature only in the central part of the heating surface. When a temperature difference occurs in the heating surface as such, there are concerns for generation of cracks and deformation in the central part of the heating surface. Therefore, there is concern that the useful life will be shortened.

Furthermore, in the case where the plate and the cylindrical member are joined and integrated, when the plate and the cylindrical member are made of different materials differing in thermal conductivity as described in Japanese Patent Application Laid-open 2003-309049, there are concerns for breakage and deformation at the junction of the plate and the cylindrical member due to difference in coefficient of thermal expansion therebetween. Therefore, there is concern that the useful life will be shortened.

SUMMARY OF THE INVENTION

An objective of the present invention is to make the temperature at a heating surface of a heating device uniform and improve the useful life of the heating device.

A heating device, according to an embodiment of the present invention, includes a substrate having a heating surface, a heating element buried in the substrate, a cylindrical member joined to the substrate, and lead wires for supplying current to the heating element. In addition, the thermal conductivity of the substrate is about 1.0 to about 2.0 times the thermal conductivity of the cylindrical member. With such a heating device, the temperature at the heating surface can be uniform, and the useful life of the heating device may be improved by preventing generation of cracks and deformation.

A heating device, according to an embodiment of the present invention, includes a substrate having a heating surface, a heating element buried in the substrate, a cylindrical member joined to the substrate, and lead wires for supplying current to the heating element. In addition, the thermal emissivity of the substrate is equal to or greater than the thermal emissivity of the cylindrical member. With such a heating device, the temperature at the heating surface can be uniform, and the useful life of the heating device may be improved by preventing generation of cracks and deformation.

DETAILED DESCRIPTION OF THE EMBODIMENTS

Figure 1:
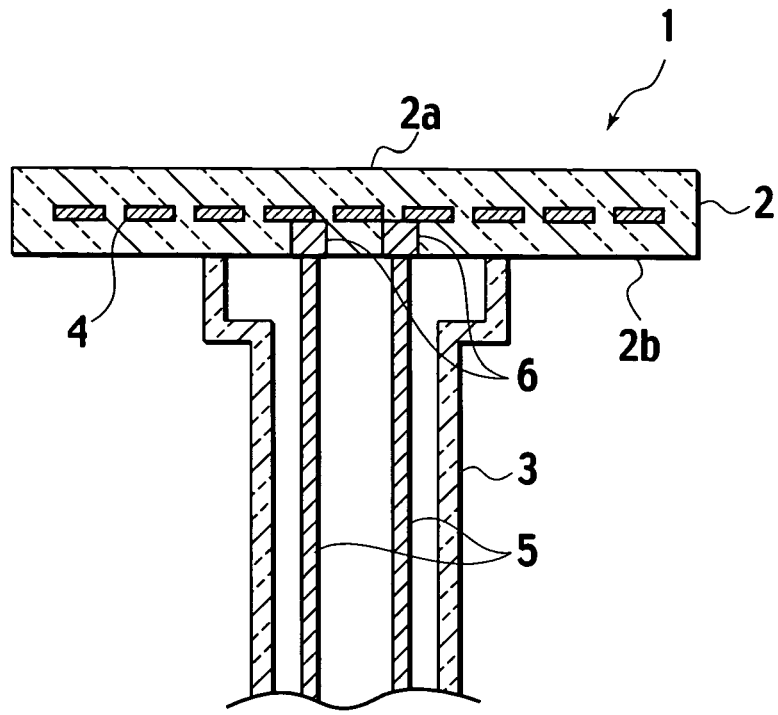
FIG. 1 is a cross-sectional view of a ceramic heater according to an embodiment of the present invention.

A heating device according to an embodiment of the present invention includes a substrate, a heating element, a cylindrical member, and lead wires. The substrate has a heating surface. The heating element is buried in the substrate. The cylindrical member is joined to the substrate. More specifically, the cylindrical member may be joined to the underside of the substrate (the opposite side of the heating surface). Lead wires supply current to the heating element in the substrate.

The thermal conductivity of the substrate is preferably about 1.0 to about 2.0 times the thermal conductivity of the cylindrical member. When the thermal conductivity of the substrate is less than about 1.0 time that of the cylindrical member, more heat flows out from the substrate to the cylindrical member. That is unfavorable in respect to securing uniformity. Furthermore, there is concern that the central part of the substrate will crack. Meanwhile, when the thermal conductivity of the substrate is greater than about 2.0 times that of the cylindrical member, there is concern for breakage since difference in linear expansion coefficient between the substrate and the cylindrical member increases and difference in coefficient of thermal expansion also increases. Accordingly, adjustment of the thermal conductivity of the substrate to be about 1.0 to about 2.0 times that of the cylindrical member allows a uniform temperature throughout the heating surface, and improvement in useful life of the heating device by preventing generation of cracks and deformation due to difference in temperature or coefficient of thermal expansion.

In this case, it is preferable that the thermal conductivity of the substrate is from about 60 to about 220 W/mK, and the thermal conductivity of the cylindrical member is from about 60 to about 200 W/mK. This can provide a more stable heating device to heat.

Furthermore, the thermal emissivity of the substrate is preferably equal to or greater than the thermal emissivity of the cylindrical member. This allows an increase in heat radiation of the substrate since the substrate has the high thermal emissivity. As a result, the temperature of the entire substrate can be uniform, and cracking at the central part of the substrate can be prevented. Accordingly, adjustment of the thermal emissivity of the substrate to be equal to or greater than that of the cylindrical member allows a uniform temperature at the heating surface, and improvement in useful life of the heating device by preventing generation of cracks and deformation due to difference in temperature.

In this case, it is preferable that the thermal emissivity of the substrate is from about 0.6 to about 0.9, and the thermal emissivity of the cylindrical member is from about 0.5 to about 0.7. This can provide a more stable heating device to heat.

In addition, the ratio of the linear expansion coefficient of the substrate to the linear expansion coefficient of the cylindrical member is preferably from about 0.9 to 1.1. Accordingly, difference in coefficient of thermal expansion between the substrate and the cylindrical member may be kept small, thereby further preventing generation of cracks in the central part of the substrate.

Next, the heating device of this embodiment is described taking a ceramic heater as an example.

(Ceramic Heater)

A ceramic heater 1, according to the embodiment of the present invention, includes a plate 2, a heating element 4, a cylindrical member 3, and lead wires 5, as shown in FIG. 1. The plate 2 is the substrate having a heating surface 2a. An object to be heated is placed on the heating surface 2a. For example, a substrate such as a semiconductor wafer or a liquid crystal substrate is placed on the heating surface 2a as the object to be heated.

The heating element 4 is buried in the plate 2. The heating element 4 receives power from the lead wires and generates heat so as to raise the temperature of the heating surface 2a. A resistance heating element made of a refractory material such as molybdenum, tungsten, tungsten carbide or the like may be used for the heating element 4.

The cylindrical member 3 is joined to the plate 2. The cylindrical member 3 is joined to the underside 2b of the plate 2 (the opposite side of the heating surface 2a). In addition, the cylindrical member 3 supports the plate 2.

Lead wires 5 supply current to the heating element 4. Lead wires 5 are housed in the cylindrical member 3. Note that terminals 6 are buried in the plate 2. Terminals 6 supply current to the heating element 4 from the lead wires 5. Then the lead wires 5 are connected to the heating element 4 via the terminals 6 so as to supply current to the heating element 4.

The plate 2 and the cylindrical member 3 are made of ceramics. Both the plate 2 and the cylindrical member 3 preferably include aluminum nitride (AlN). Accordingly, when incorporated in a semiconductor manufacturing apparatus, the ceramic heater 1 may have high corrosion resistance to a corrosive gas such as a halogen gas. Both the plate 2 and the cylindrical member 3 more preferably include aluminum nitride as a main ingredient.

In the ceramic heater 1, the thermal conductivity of the plate 2 is preferably about 1.0 to about 2.0 times the thermal conductivity of the cylindrical member 3. The difference in thermal conductivity being about 1.0 to about 2.0 times prevents generation of cracks or deformation in the central part of the plate 2 because heat flowing out from the plate 2 to the cylindrical member 3 can be limited. It is further preferable that the thermal conductivity of the plate 2 is from about 60 to about 220 W/mK, and the thermal conductivity of the cylindrical member 3 is from about 60 to about 200 W/mK.

Furthermore, the thermal emissivity of the plate 2 is preferably equal to or greater than the thermal emissivity of the cylindrical member 3. This allows an increase in heat radiation of the plate 2 since the plate 2 has the high thermal emissivity. As a result, the temperature of the entire plate 2 can be uniform, and cracking and deformation at the central part of the plate 2 can be prevented. It is preferable that the thermal emissivity of the plate 2 is from about 0.6 to about 0.9, and the thermal emissivity of the cylindrical member 3 is from about 0.5 to about 0.7.

Furthermore, the rate of the linear expansion coefficient of the plate 2 to the linear expansion coefficient of the cylindrical member 3 is preferably from about 0.9 to about 1.1. Accordingly, since the difference in linear expansion coefficient between the plate 2 and the cylindrical member 3 is small, the difference in coefficient of thermal expansion between the plate 2 and the cylindrical member 3 is very little, and therefore, the generation of cracks in the central part of the plate 2 can be further prevented. For example, the rate of the liner expansion coefficient of the plate 2 to tat of the cylindrical member 3 may be about 1.04.

Such ceramic hearer 1 provides a uniform temperature at the heating surface 2a, and improves the useful life thereof by preventing generation of cracks or deformation due to the difference in temperature or coefficient of thermal expansion. Such ceramic heater 1 heats an object such as a semiconductor wafer or a liquid crystal substrate uniformly. Therefore, the ceramic heater 1 may be preferably used for a semiconductor manufacturing apparatus, a liquid crystal manufacturing apparatus, an etching device, or the like. For example, it may be used for heating a semiconductor wafer through thermal CVD which manufactures a semiconductor thin film on the semiconductor wafer using a source gas such as silane gas.

(Manufacturing Method for Ceramic Heater)

Figure 2:
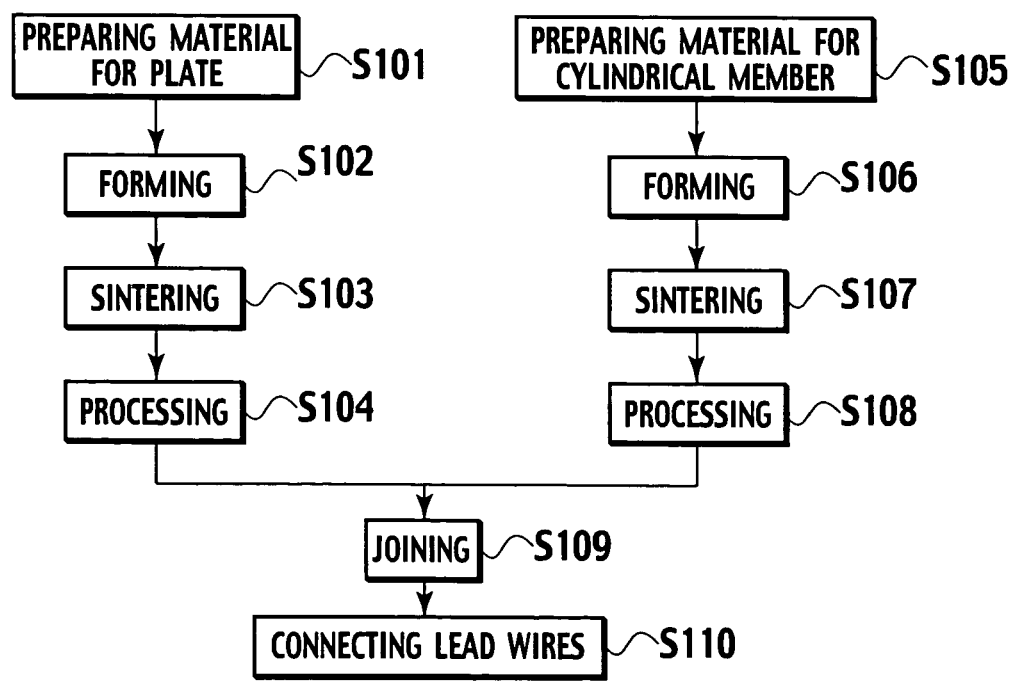
FIG. 2 is a flowchart showing a manufacturing method for the ceramic heater according to the embodiment of the present invention.

Next, a manufacturing method for the ceramic heater 1, according to the embodiment of the present invention, is described with reference to FIG. 2. To begin with, a plate 2 and a cylindrical member 3 are formed. The plate 2 is formed through steps (S101) to (S104), and the cylindrical member 3 is formed through steps (S105) to (S108).

To begin with, forming the plate 2 is described. Material for the plate 2 is prepared (S101). More specifically, a ceramic powder such as aluminum nitride for making the plate 2 is mixed with a binder. The mixing method may use, for example, a large ball milling machine called a trommel that rotates itself. A mixing time using the trommel is around 30 minutes, for example. Granulation is then carried out by a granulating machine such as a spray dryer (SD), providing a granulated powder.

Next, the resulting granulated powder is formed into a preform by uniaxial pressing through press machine. A compact in which a heating element 4 and terminals 6 are buried is formed using these preform. For example, two preforms are formed. Once the heating element 4 and the terminals 6 are placed on one of the preforms, the other preform is placed on the heating element 4 and the terminals 6, and pressed by press machine, thereby forming the compact in which heating element 4 and terminals 6 are buried (S102). In this case, the heating element 4 and the terminals 6 are arranged close to each other, allowing electrical connection.

Next, the compact is put in a sintering furnace and sintered (S103). For example, the compact may be sintered through hot pressing while holding the compact in a hot pressing sintering furnace. Alternatively, for example, the compact may be held in a carbon jig and sintered through uniaxial pressing at about 30 to about 50 MPa. By sintering through such hot pressing, sintering to form a densified sintered body is possible even with a ceramic material, which is difficult to densely compress through atmospheric sintering. Sintering conditions for plate 2 can be appropriately selected according to the kind of ceramic powder used as material and the size of the plate 2. For example, as sintering conditions for the plate 2 made of aluminum nitride, a sintering temperature of about 1850° C. to about 2000° C., pressure of about 100 to about 300 kg/cm$^2$, and a sintering time of about 2 to about 5 hours are preferred.

The resulting sintered body of the plate 2 is then processed (S104). For example, the heating surface 2a of the plate 2 is lapped, and the sides of the plate 2 are ground.

Next, forming the cylindrical member 3 is described. To begin with, material for the cylindrical member 3 is prepared (S105). More specifically, a ceramic powder such as aluminum nitride for making the cylindrical member 3 is mixed with a binder. Granulation is then carried out by a granulating machine such as a spray dryer (SD), providing a granulated powder.

The resulting granulated powder is then formed into a compact through cold isostatic pressing (CIP) or the like (S106). For example, after a uniaxial compact is formed through a mold forming method, the resulting compact undergoes processing through CIP. According to this processing, the uniaxial compact is formed under isotropic pressure, thereby improving density and uniformity of the compact. Alternatively, the mold forming step may be omitted, and a compact may be provided by directly filling a granulated powder in a rubber die and forming through CIP.

The compact of the cylindrical member 3 is placed in a sintering furnace and sintered (S107). For example, the compact may be held in an atmospheric sintering furnace and then sintered through atmospheric sintering. Sintering conditions for cylindrical member 3 can be appropriately selected according to the kind of ceramic powder used as material and the size of the cylindrical member 3. For example, as sintering conditions for the cylindrical member 3 made of aluminum nitride, a sintering temperature of about 1600° C. to about 2000° C., pressure of about 1 to about 30 kg/cm$^2$, and a sintering time of about 1 to about 5 hours are preferred.

The resulting sintered body of the cylindrical member 3 is then processed (S108). For example, the outer surface of the cylindrical member 3 and the joint surface to the plate 2 are lapped.

Next, the resulting plate 2 and the cylindrical member 3 are joined together (S109). For example, the plate 2 and the cylindrical member 3 may be joined together in the furnace through direct bonding. A rare-earth compound or the like may be used as a bonding agent. For example, once the bonding agent is applied to either one or both of the joint surfaces of the plate 2 and the cylindrical member 3, the joint surfaces are bonded together and can be joined through a heat treatment. Pressure may be applied in a perpendicular direction to the joint surfaces as required. This allows solid-phase bonding of the plate 2 and the cylindrical member 3. Heat treatment conditions for this joining can be appropriately selected according to material and size of the plate 2 and the cylindrical member 3. For example, when the plate 2 and the cylindrical member 3 are made of aluminum nitride, a heating temperature of about 1850° C. to about 2000° C., pressure of about 100 to about 300 kg/cm$^2$, a heating time of about 2 to about 5 hours, and a nitrogen atmosphere are preferred.

Next, lead wires 5 are connected to the heating element 4 (S110). More specifically, the lead wires 5 are connected to the terminals 6, which are connected to the heating element 4, and the heating element 4 and the lead wires 5 are connected via the terminals 6. The lead wires 5 are inserted and housed inside the cylindrical member 3. For example, the lead wires 5 may be joined to the terminals 6 through brazing, welding or the like. Brazing may be carried out in the furnace, for example.

Finally, the plate 2 and the cylindrical member 3 are processed as needed, and after rinsing, are evaluated for temperature uniformity.

According to such a manufacturing method for the ceramic heater 1, the thermal conductivity of the plate 2 may be adjusted to about 1.0 to about 2.0 times that of the cylindrical member 2. More specifically, the thermal conductivity of the plate 2 may be from about 60 to about 220 W/mK, and that of the cylindrical member 3 may be from about 60 to about 200 W/mK. Furthermore, the thermal emissivity of the plate 2 may be adjusted to be equal to or greater than that of the cylindrical member 3. More specifically, the thermal emissivity of the plate 2 may be from about 0.6 to about 0.9, and that of the cylindrical member 3 may be from about 0.5 to about 0.7. Furthermore, the ratio of the linear expansion coefficient of the plate 2 to that of the cylindrical member 3 may be from about 0.9 to about 1.1. For example, appropriate adjustment of material of the plate 2 and the cylindrical member 3 and the sintering conditions such as sintering temperature, pressure to be applied when sintering, sintering time, and sintering method allows adjustment of the relationship between the plate 2 and the cylindrical member 3 to fall within the above-mentioned ranges.

Therefore, such a manufacturing method for the ceramic heater may provide the ceramic heater 1 having the uniform temperature at the heating surface 2a and the long useful life by preventing generation of cracks or deformation due to the difference in temperature or coefficient of thermal expansion.

EXAMPLES

With the following working examples and comparative examples, the plate 2 is sintered in a hot pressing sintering furnace, and the cylindrical member 3 is formed through CIP and sintered in an atmospheric sintering furnace.

First Working Example

Using an aluminum nitride powder as a main ingredient, the plate 2 and the cylindrical member 3 are formed using the above-described manufacturing method for the ceramic heater 1. Note that sintering conditions for the plate 2 are set to a sintering temperature of 1900° C., pressure of 300 kg/cm$^2$, and a sintering time of 5 hours. Meanwhile, sintering conditions for the cylindrical member 3 are set to a sintering temperature of 1650° C., pressure of 10 kg/cm$^2$, and a sintering time of 1 hour. The thermal conductivity and the thermal emissivity of the plate 2 and of the cylindrical member 3 are then measured.

Furthermore, according to the above-mentioned manufacturing method for the ceramic heater 1, the plate 2 and the cylindrical member 3 are joined together. Using the resulting ceramic heater 1 as a semiconductor manufacturing apparatus, a heating and cooling cycle test is performed to evaluate the durable operating count under conditions of a working temperature of 20° C. to 750° C. and pressure of $1 \times 10^{-3}$ Torr. Furthermore, temperatures at the central part of the heating surface 2a while the ceramic heater 1 is in operation, and at part 2 cm from the periphery of the heating surface 2a (referred to as 'end' hereafter) are measured.

Second Working Example

The plate 2 and the cylindrical member 3 are formed and the thermal conductivity and the thermal emissivity are measured as with the first working example, except for sintering conditions. Further, according to the above-mentioned manufacturing method for the ceramic heater 1, the plate 2 and the cylindrical member 3 are joined together. Using the resulting ceramic heater 1 as a semiconductor manufacturing apparatus, a heating and cooling cycle test is performed to evaluate the durable operating count under conditions of a working temperature of 20° C. to 600° C. and a $N^2$ atmosphere of 10 Torr. Furthermore, temperatures at the central part and end of the heating surface 2a while the ceramic heater 1 is in operation are measured.

First Comparative Example

Sintering conditions for the plate 2 are set to a sintering temperature of 1560° C., a pressure of 50 kg/cm$^2$, and a sintering time of 6 hours. Sintering conditions for the cylindrical member 3 are set to a sintering temperature of 1510° C., pressure of 3 kg/cm$^2$, and a sintering time of 8 hours. Aside from this, the plate and the cylindrical member are formed and the thermal conductivity and the thermal emissivity are measured as with the first working example. Furthermore, the plate and the cylindrical member are joined together. Using the resulting ceramic heater as a semiconductor manufacturing apparatus, a heating and cooling cycle test is performed to evaluate the durable operating count under conditions of a working temperature of 20° C. to 600° C. and a $N^2$ atmosphere of 10 Torr. Furthermore, temperatures at the central part and end of the heating surface while the ceramic heater is in operation are measured.

Second Comparative Example

The plate and the cylindrical member are formed and the thermal conductivity and the thermal emissivity are measured as with the first comparative example, except for sintering conditions. Further, the plate and the cylindrical member are joined together. Using the resulting ceramic heater as a semiconductor manufacturing apparatus, a heating and cooling cycle test is performed to evaluate the durable operating count under conditions of a working temperature of 20° C. to 600° C. and a $N^2$ atmosphere of 10 Torr. Furthermore, temperatures at the central part and end of the heating surface while the ceramic heater is in operation are measured.

Evaluation results of working examples 1 and 2 and comparative examples 1 and 2 are given in Table 1.

TABLE 1

| | THERMAL CONDUCTIVITY (W/m · K) | THERMAL EMISSIVITY | LINEAR EXPANSION COEFFICIENT ($10^{-6}$° C.) | DURABLE OPERATING COUNT (TIMES) | TEMPERATURE AT CENTRAL PART (° C.) | TEMPERATURE AT END (° C.) |
|---|---|---|---|---|---|---|
| WORKING EXAMPLE 1 | PLATE: 156 CYLINDRICAL MEMBER: 78 | PLATE: 0.60 CYLINDRICAL MEMBER: 0.55 | PLATE: 5.7 CYLINDRICAL MEMBER: 5.5 | >2000 | 751 | 747 |
| WORKING EXAMPLE 2 | PLATE: 80 CYLINDRICAL MEMBER: 60 | PLATE: 0.82 CYLINDRICAL MEMBER: 0.50 | PLATE: 5.5 CYLINDRICAL MEMBER: 5.5 | >2000 | 602 | 599 |
| COMPARATIVE EXAMPLE 1 | PLATE: 60 CYLINDRICAL MEMBER: 80 | PLATE: 0.55 CYLINDRICAL MEMBER: 0.47 | PLATE: 5.5 CYLINDRICAL MEMBER: 5.5 | 430 | 599 | 611 |
| COMPARATIVE EXAMPLE 2 | PLATE: 210 CYLINDRICAL MEMBER: 51 | PLATE: 0.61 CYLINDRICAL MEMBER: 0.42 | PLATE: 5.9 CYLINDRICAL MEMBER: 5.3 | 352 | 603 | 601 |

The ceramic heaters 1 of the first working example and the second working example do not generate cracks in the central part of the plate 2 and in the junction of the plate 2 and the cylindrical member 3 and do not occur deformation even when the heating and cooling cycle test is performed 2000 times. In other words, the ceramic heaters 1 of the first and the second working example have a large durable operating count and very long useful life. Note that once the heating and cooling cycle test is performed 2000 times, the test is finished.

On the other hand, the ceramic heater of the first comparative example generates cracks in the central part of the plate when the heating and cooling cycle test is performed 430 times. Further, the ceramic heater of the second comparative example generates cracks in the junction of the plate and the cylindrical member when the heating and cooling cycle test is performed 352 times. Accordingly, the ceramic heaters of the first and the second comparative example have very short useful life with a small durable operating count.

In addition, the temperature difference between the central part and the end of the heating surface 2a in the ceramic heater 1 of the first working example is 4.0° C., which is very small. Furthermore, the temperature difference between the central part and the end of the heating surface 2a in the ceramic heater 1 of the second working example is 3.0° C., which is also very small. Accordingly, the temperature at the heating surfaces 2a in the ceramic heaters 1 of the first and the second working example is very uniform.

On the other hand, the temperature difference between the central part and the end of the heating surface in the ceramic heater 1 of the first working example is 12.0° C., which is large, and there is variance of the temperature distribution in the heating surface.

According to the ceramic heaters 1 of the first and the second working example, the thermal conductivity of the plate 2 is about 1.0 to about 2.0 times that of the cylindrical member 3. In addition, with the ceramic heaters 1 of the first and the second working example, the thermal conductivity of the plate 2 is from about 60 to about 220 W/mK, and that of the cylindrical member 3 is from about 60 to about 200 W/mK. Therefore, appropriate adjustment of the thermal conductivity of the plate 2 and the cylindrical member 3 can provide a ceramic heater 1, which has uniform temperature in the heating surface 2a and is stable without generating cracks in the plate 2.

Furthermore, according to the ceramic heaters 1 of the first and the second working example, the thermal emissivity of the plate 2 is equal to or greater than that of the cylindrical member 3, where the thermal emissivity of the plate 2 is from about 0.6 to about 0.9 and that of the cylindrical member 3 is from about 0.5 to about 0.7. Furthermore, the ratio of the linear expansion coefficient of the plate 2 to that of the cylindrical member 3 is from about 0.9 to about 1.1. Therefore, appropriate adjustment of the thermal emissivity of the plate 2 and the cylindrical member 3 can provide a ceramic heater 1, which has uniform temperature in the heating surface 2a and is stable without generating cracks at the junction of the plate 2 and the cylindrical member 3.

Although the inventions have been described above by reference to certain embodiments of the inventions, the inventions are not limited to the embodiments described above. Modifications and variations of the embodiments described above will occur to those skilled in the art, in light of the above teachings.

For example, with the above embodiment, the plate 2 and the cylindrical member 3 are made of aluminum nitride; however, they may be made of a lot of kind of ceramic material. For example, the plate 2 and the cylindrical member 3 can be made of nitride ceramics such as silicon nitride, boron nitride or the like, oxide ceramics such as alumina ($Al_2O_3$), sialon (SiAlON) or the like, carbide ceramics such as silicon carbide (SiC) or the like, an alumina-silicon carbide composite or the like. Furthermore, the plate 2 and the cylindrical member 3 may be made of materials other than ceramics such as aluminum (Al), an aluminum alloy, an aluminum alloy-aluminum nitride composite, an aluminum alloy-SiC composite or the like.

What is claimed is:

1. A heating device, comprising:
   an aluminum nitride substrate having a heating surface;
   a heating element buried in the substrate;
   an aluminum nitride cylindrical member joined to the substrate; and
   lead wires for supplying current to the heating element, wherein
   the thermal conductivity of the substrate is greater than 1.0 to about 2.0 times the thermal conductivity of the cylindrical member;
   the thermal emissivity of the substrate is greater than the thermal emissivity of the cylindrical member;
   the thermal emissivity of the substrate is from about 0.6 to about 0.9; and
   the thermal emissivity of the cylindrical member is from about 0.5 to about 0.7.

2. The heating device of claim 1, wherein the thermal conductivity of the substrate is greater than 60 to about 220 W/mK, and the thermal conductivity of the cylindrical member is from about 60 to about 200 W/mK.

* * * * *